United States Patent [19]
Blackham et al.

[11] Patent Number: 6,060,888
[45] Date of Patent: May 9, 2000

[54] ERROR CORRECTION METHOD FOR REFLECTION MEASUREMENTS OF RECIPROCAL DEVICES IN VECTOR NETWORK ANALYZERS

[75] Inventors: David V. Blackham; Jason Chodora, both of Santa Rosa; Joel P. Dunsmore, Sebastopol, all of Calif.

[73] Assignee: Hewlett-Packard Company, Palo Alto, Calif.

[21] Appl. No.: 09/066,801

[22] Filed: Apr. 24, 1998

[51] Int. Cl.$^7$ .............................. G01R 27/28; G01R 35/00
[52] U.S. Cl. ............................ 324/601; 324/638; 324/646
[58] Field of Search ................................. 324/601, 637, 324/638, 642, 646

[56] References Cited

U.S. PATENT DOCUMENTS

| | | | |
|---|---|---|---|
| 4,816,767 | 3/1989 | Cannon et al. | 324/601 |
| 4,845,423 | 7/1989 | Pollard | 324/74 |
| 4,853,613 | 8/1989 | Sequeira et al. | 324/601 |
| 4,858,160 | 8/1989 | Strid et al. | 324/638 X |
| 4,982,164 | 1/1991 | Schiek et al. | 324/638 |
| 5,548,538 | 8/1996 | Grace et al. | 324/642 X |
| 5,608,330 | 3/1997 | Heuermann et al. | 324/601 |
| 5,715,183 | 2/1998 | Grace et al. | 324/642 X |
| 5,748,000 | 5/1998 | Blackham | 324/601 |

OTHER PUBLICATIONS

Two–Part Network Analyzer Calibration Using An Unknown "Thru"; by Andrea Ferrero, Member IEEE, Umberto Pisani; by IEEE MW Letters, Dec. 1992, vol. 2, No. 12.

A New Procedure For System Calibration And Error Removal In Automated S–Parameter Measurements; by Norman R. Franzen, Ross A. Speciale; by 5th European Microwave Conference, Sep. 1975.

*Primary Examiner*—Glenn W. Brown
*Attorney, Agent, or Firm*—John L. Imperato

[57] ABSTRACT

An error correction method improves measurement accuracy of a vector network analyzer by reducing reflection measurement errors for a broad class of devices, such as filters, switches, cables, couplers, attenuators, and other passive devices tested by vector network analyzers (VNAs) that are reciprocal, having a forward transmission coefficient $S_{21}$ and a reverse transmission coefficient $S_{12}$ that are equal. Errors due to impedance mismatches at the load port of a transmission/reflection (T/R) test set are corrected without impacting the measurement speed of the VNA. The source port of the T/R test set is calibrated and a reflection measurement is performed while an impedance matched thruline standard of known electrical length is coupled between the source port and load port of the T/R test set. The reflection measurement is corrected for the electrical length of the thruline standard to obtain a reflection measurement of the load port of the T/R test set. Then, the transmission and reflection characteristics of the DUT are measured. The reciprocity of the DUT and the reflection measurement of the load port are used to extract the actual input reflection coefficient of the DUT.

4 Claims, 3 Drawing Sheets

ERROR CORRECTION METHOD FOR REFLECTION MEASUREMENTS OF RECIPROCAL DEVICES IN VECTOR NETWORK ANALYZERS

FIELD OF THE INVENTION

The present invention relates to vector network analyzers and, more particularly, to a method for correcting errors in reflection measurements of reciprocal devices caused by impedance mismatches in a vector network analyzer's test set.

BACKGROUND OF THE INVENTION

Vector network analyzers (VNAs) incorporating high frequency transmission/reflection (T/R) test sets are used to determine the transmission and reflection characteristics of various devices under test (DUTs). The measurement accuracy of a VNA generally improves as the impedances of a source port and a load port of the T/R test set more closely match a predetermined characteristic impedance. Unfortunately, limitations of the electronic hardware used within the T/R test set cause impedance mismatches at the source and load ports that increase measurement uncertainty and degrade measurement accuracy. One measurement error originates during reflection measurements of a multiport DUT. For example, when the output port of a two-port DUT is connected to the load port of the T/R test set, the measured reflection coefficient is a function of both the reflection characteristics of the DUT and the impedance of the load port of the T/R test set. As the mismatch between the load port impedance and the predetermined characteristic impedance increases, the error in the reflection measurement increases. This reflection measurement error is most prominent for DUTs such as cables or filters that have low insertion loss and that don't absorb reflections from the load port of the VNA.

A first known method for reducing reflection measurement errors in a VNA relies on a full two port characterization of the DUT, including both forward and reverse transmission and reflection measurements. Based on this two port characterization, a variety of known vector error correction techniques may be used to mathematically correct for the reflection measurement errors. However, in order to apply the known vector error correction techniques when using a T/R test set, the connection ports of the DUT must be physically reversed relative to the source and load ports to acquire the full two port characterization of the DUT. Reversing the connection ports is time consuming and perturbs the operation of the DUT. A second known method for reducing reflection measurement errors involves connecting a matched load to the output port of the DUT prior to making the reflection measurement. The connection of the matched load is also time consuming and perturbs the operation of the DUT. If reflection measurement errors due to impedance mismatches are not corrected in an effort to reduce measurement time and reduce perturbations to the DUT, the reflection measurement accuracy of the VNA is sacrificed.

SUMMARY OF THE INVENTION

A broad class of devices, such as filters, switches, cables, couplers, attenuators, and other passive devices tested by vector network analyzers (VNAs) are reciprocal, having a forward transmission coefficient $S_{21}$ and a reverse transmission coefficient $S_{12}$ that are equal. In accordance with the preferred embodiment of the present invention, an error correction method improves measurement accuracy of a vector network analyzer by reducing reflection measurement errors for reciprocal devices. Errors due to impedance mismatches at the load port of a transmission/reflection (T/R) test set are corrected without impacting the measurement speed of the VNA. Once the source port of the T/R test set is calibrated, a reflection measurement is performed while an impedance matched thruline standard of known electrical length is coupled between the source port and load port of the T/R test set. The reflection measurement is corrected for the electrical length of the thruline standard to obtain a reflection measurement of the load port of the T/R test set. Then, the transmission and reflection characteristics of the DUT are measured. The reciprocity of the DUT and the reflection measurement of the load port are used to extract the actual input reflection coefficient of the DUT.

DETAILED DESCRIPTION OF THE PREFERRED EMBODIMENT

Figure 1:
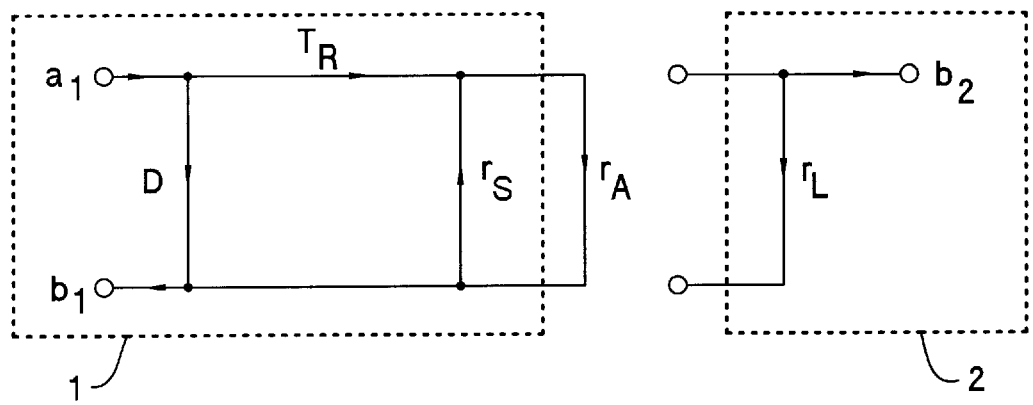
FIG. 1 shows a flowgraph of a T/R test set used for calibrating the source port of the T/R test set in accordance with the error correction method constructed according to the preferred embodiment of the present invention.
Figure 2:
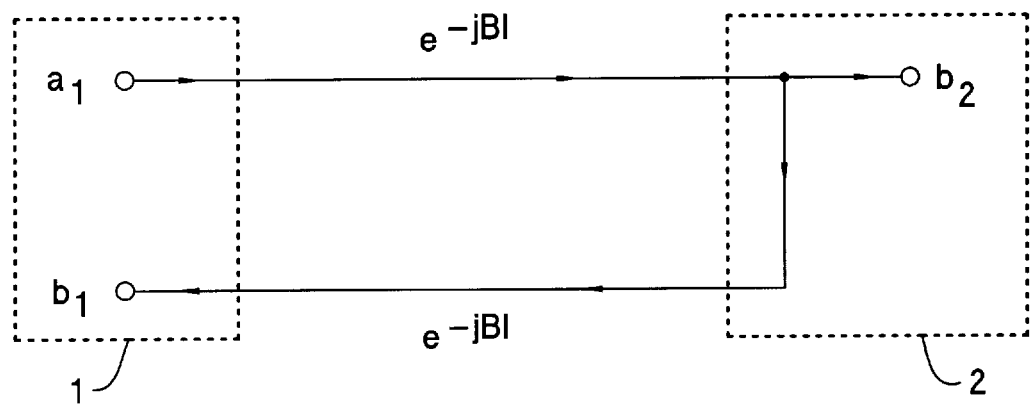
FIG. 2 shows a flowgraph of a T/R test set including a thruline standard used with the error correction method constructed according to the preferred embodiment of the present invention.
Figure 3:
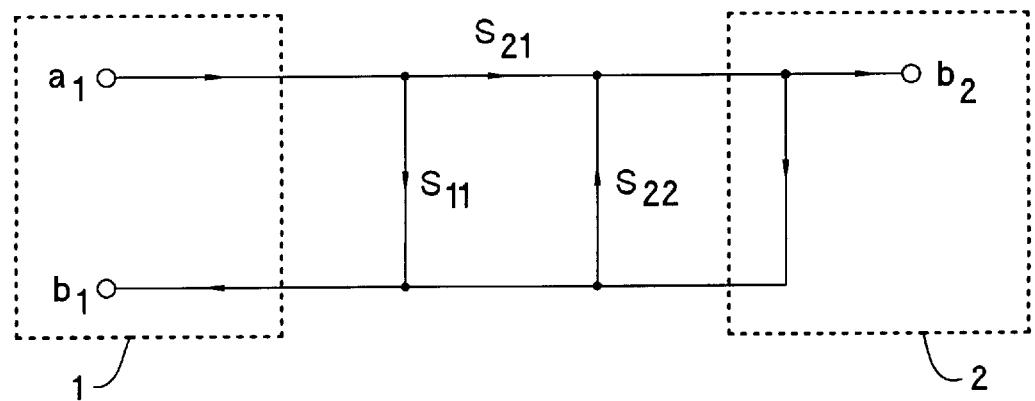
FIG. 3 shows a flowgraph of a T/R test set including a device under test used with the error correction method constructed according to the preferred embodiment of the present invention.

FIGS. 1–3 show flowgraphs of a transmission/reflection (T/R) test set for use with the error correction method constructed according to the preferred embodiment of the present invention. The T/R test set is used with a vector network analyzer (VNA) to characterize a device under test (DUT). Impedance mismatches at the source port 1 and the load port 2 of the T/R test set introduce measurement uncertainty in the measurements of the DUT. This measurement uncertainty, if not corrected or compensated for, degrades the accuracy of measurements made by the VNA. FIG. 1 shows a flowgraph of a transmission/reflection (T/R) test set used for calibrating the source port 1 of the T/R test set in accordance with the preferred embodiment of the present invention. The T/R test set enables the VNA to perform vector measurements, including magnitude and phase measurement of a DUT's forward transmission coefficient $S_{21}$ and reflection coefficient $S_{11}$. A source port 1 transmits signals $a_1$ and receives signals $b_1$, and a load port 2 receives signals $b_2$ in the VNA's T/R test set. Calibration of the source port 1 of the VNA is performed by making a reflection measurement with each of three calibration standards, such as an open, short and a matched load calibration standard, connected to the source port 1. The actual source match $\Gamma_S$ is extracted from the reflection measurements of the calibration standards according to the relationship determined from the flowgraph of FIG. 1 as:

$$\Gamma_M = \frac{b_1}{a_1} = D + \frac{T_R \Gamma_A}{1 - \Gamma_A \Gamma_S}$$

where D is the directivity of the source port 1, $T_R$ is the reflection tracking of the source port 1, $\Gamma_A$ is the actual reflection coefficient of the particular calibration standard used, and $\Gamma_M$ is the measured reflection coefficient of the source port 1, including the effects of D, $T_R$ and the source match $\Gamma_S$. Three contributors to the error in the measured reflection coefficient $\Gamma_M$ are the directivity D, the reflection tracking $T_R$ and the source match $\Gamma_S$. These error contributors are characterized as a result of reflection measurements of three calibration standards. The three calibration standards, such as an open standard, a short standard and matched load standard each have a known reflection coefficient $\Gamma_A$ that is unique to the particular calibration standard. Using the expression for $\Gamma_M$, a reflection measurement is made for each of the calibration standards. Based on these measurements, three equations are obtained and used to compute the error contributors. The effects of the three error contributors are compensated for when subsequent reflection measurements are made using the T/R test set.

FIG. 2 shows a flowgraph of a T/R test set including a thruline standard used with the error correction method constructed according to the preferred embodiment of the present invention. The impedance match of the load port 2, or load match $\Gamma_L$, is calibrated by connecting a thruline standard between the source port 1 and the load port 2 of the T/R test set. The electrical length of the thruline standard is known. A reflection measurement is performed and the reflection measurement $\Gamma_{LM}$ is corrected for the electrical length Bl of the thruline standard to obtain the load match $\Gamma_L$ according to the relationship determined from the flowgraph of FIG. 2:

$$\Gamma_L = \Gamma_{LM}/e^{-j2Bl}$$

When the source port 1 and the load port 2 directly mate with each other, the electrical length Bi is zero and the load match $\Gamma_L$ is measured directly. When the source port 1 and the load port 2 do not directly mate, a thruline standard of finite electrical length Bl is used. The thruline standard is chosen to have a match that is at least 10 dB better than the match of the DUT, so as to not negatively impact the accuracy of the reflection measurement of the DUT. Accuracy of the reflection measurements is further improved by performing an additional one-port calibration while the thruline standard is connected to the source port 1. This allows for direct measurement of the load match while providing compensating for both mismatch and delay of the thruline standard.

FIG. 3 shows a flowgraph of the T/R test set, including a DUT, used in accordance with the preferred embodiment of the present invention to assess a measured reflection coefficient $S_{11M}$ of the DUT. The measured reflection coefficient $S_{11M}$ is a function of the S-parameters, $S_{11}$, $S_{22}$, $S_{21}$ and $S_{12}$, of the DUT, as well as the load match $\Gamma_L$. The measured reflection coefficient $S_{11M}$ is derived from the flowgraph of FIG. 3 as:

$$S_{11M} = \frac{b_1}{a_1}\bigg|_{\Gamma_{L\neq 0}} = S_{11} + \frac{S_{21}S_{12}\Gamma_L}{1 - S_{22}\Gamma_L}$$

Since the DUT is a reciprocal device, the forward transmission coefficient $S_{21}$ and the reverse transmission coefficient $S_{12}$ are equal. Making the assumption that the product $S_{22}\Gamma_L$ is small, the reflection coefficient $S_{11}$ extracted from the measured reflection $S_{11M}$ coefficient as:

$$S_{11} = S_{11M} - S_{21}{}^2\Gamma_L$$

Figure 4:
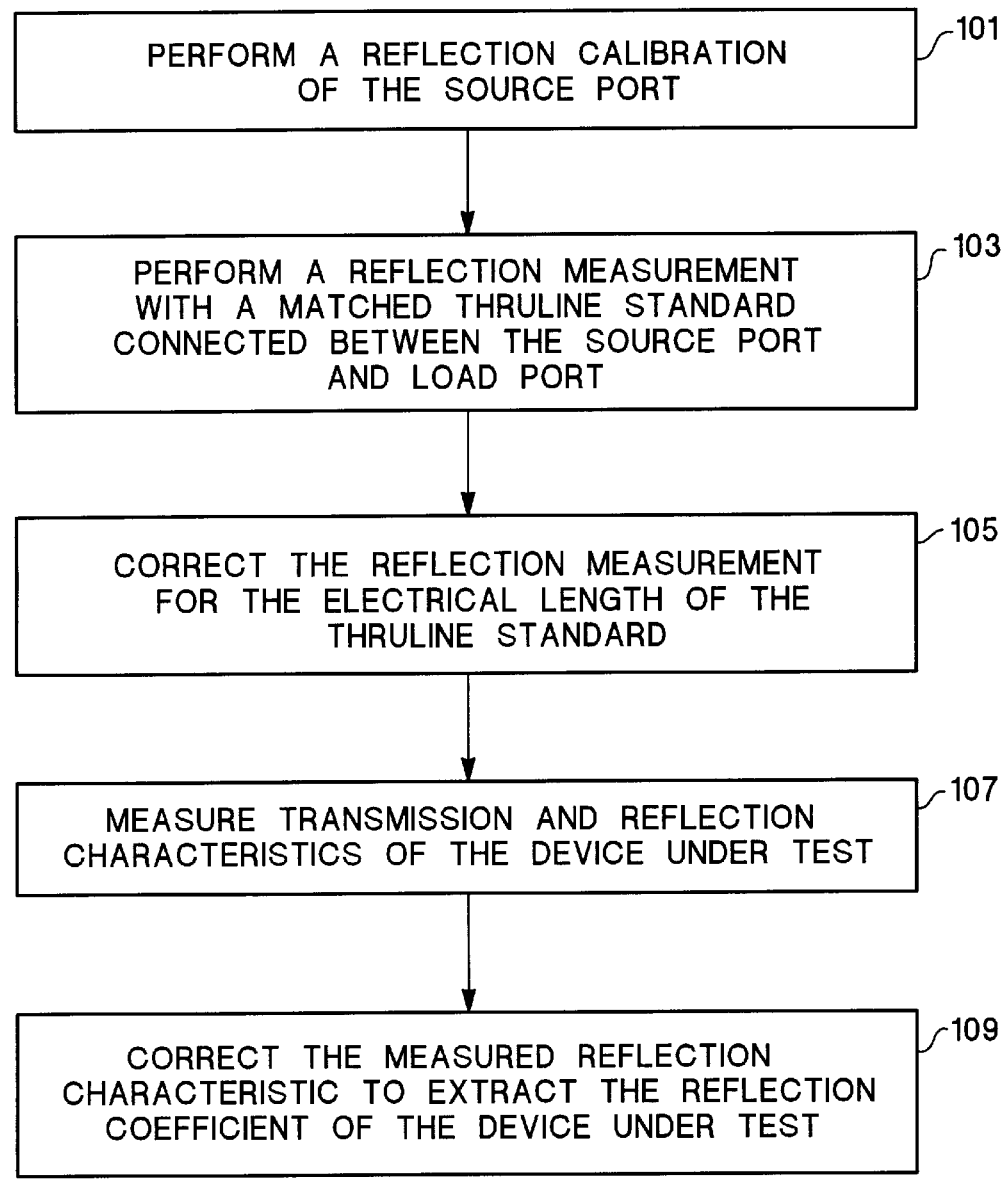
FIG. 4 shows a flow diagram of the error correction method constructed according to the preferred embodiment of the present invention.

The forward transmission coefficient $S_{21}$ can be determined using a variety of known measurement techniques or alternatively using the Error Correction Method For Transmission Measurements In Vector Network Analyzers, disclosed in U.S. Pat. No. 5,748,000, filed on Jul. 1, 1996. Since the T/R test set does not rely on a full two-port calibration of the DUT, the term $S_{22} \Gamma_L$ remains as a residual error term, whereas the term $S_{21}{}^2\Gamma_L$ is corrected. FIG. 4 is a flow diagram 100 of the error correction method for reflection measurements of reciprocal devices constructed according to the preferred embodiment of the present invention. In step 101 a reflection calibration is performed using calibration standards connected to the source port 1. In step 103 a reflection measurement is performed while a thruline standard is connected between the source port 1 and the load port 2 of the T/R test set. The reflection measurement is corrected for the electrical length of the thruline standard in step 105 to yield the reflection coefficient of the port $\Gamma_L$. In step 105 the forward reflection and transmission characteristics are measured with the DUT connected between the source port 1 and the load port 2. In step 109, the forward reflection coefficient $S_{11}$ of the reciprocal device under test is extracted by correcting the forward reflection characteristic according to the reflection calibration of the source port from step 101, the reflection coefficient of the load port $\Gamma_L$ and the measured transmission characteristic $S_{21}$.

Figure 5:
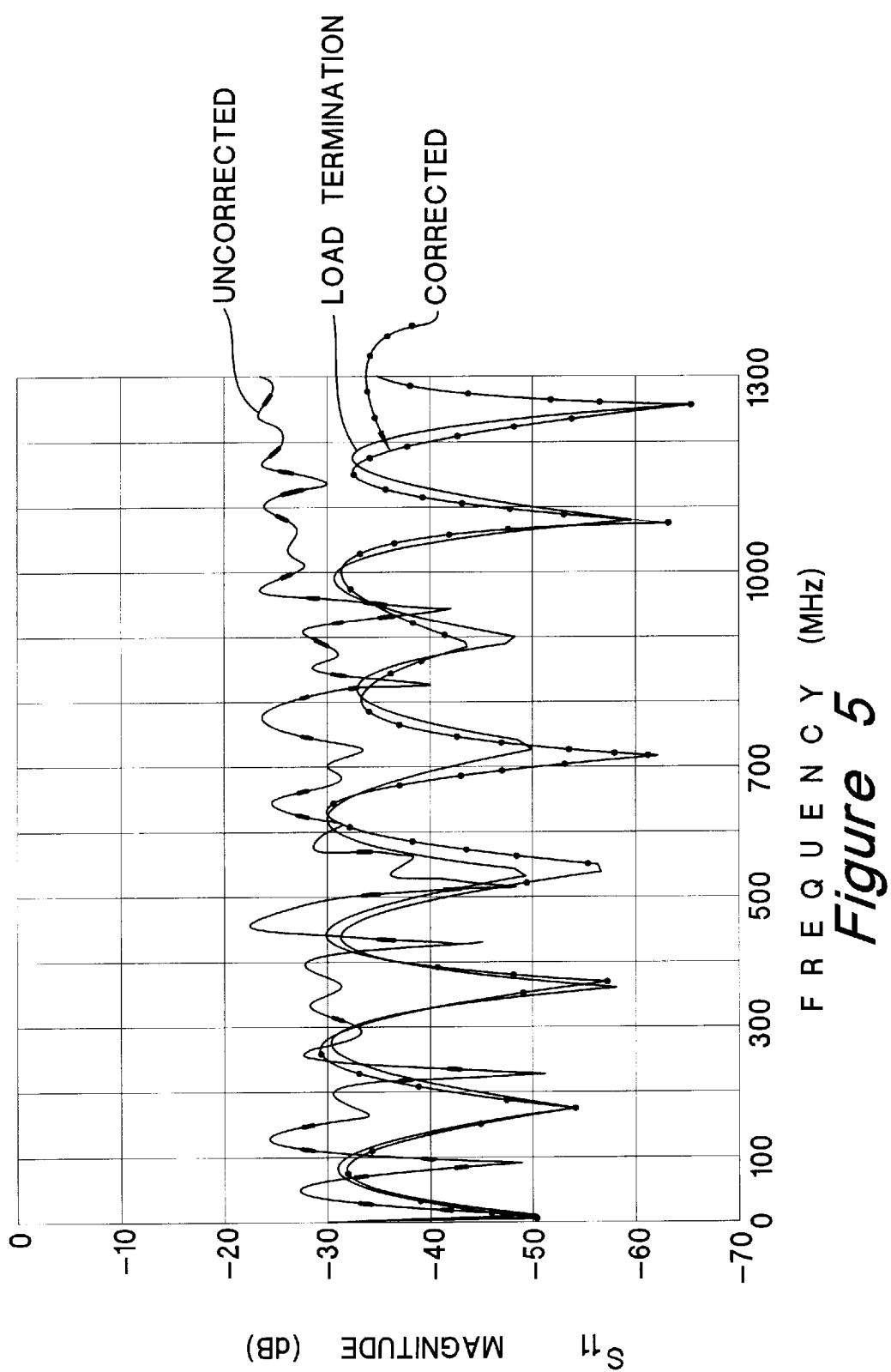
FIG. 5 shows a reflection measurement using the error correction method constructed according to the preferred embodiment of the present invention.

FIG. 5 shows a reflection measurement using the error correction method constructed according to the preferred embodiment of the present invention. The magnitude of the reflection coefficient S11 extracted using the error correction method is shown in comparison to a reflection measurement in which the DUT is terminated using a matched load instead of the load port 2. A reflection measurement is also shown in which the DUT is terminated by the load port 2, but the measurement is uncorrected for the load match $\Gamma_L$ of the load port 2 of the T/R test set.

The error correction method reduces the effects of impedance mismatches in a T/R test set and improves the accuracy of transmission measurements made by vector network analyzers, without decreasing measurement speed. The error correction method may be implemented in software, internal or external to the VNA and T/R test set, or the error correction method may be implemented in the VNA's internal firmware.

What is claimed is:

1. A method for correcting reflection measurements of a reciprocal device under test in a vector network analyzer having a source port and a load port, the method comprising the steps of:

performing a reflection calibration of the source port;

performing a reflection measurement with a matched thruline standard having predetermined electrical length, connected between the source port and the load port;

correcting the reflection measurement according to the electrical length of the thruline standard to extract a reflection coefficient of the load port;

measuring a transmission coefficient and a reflection coefficient when the reciprocal device under test is connected between the source port and the load port; and correcting the measured reflection coefficient according to the reflection calibration of the source port, the measured transmission coefficient and the reflection coefficient of the load port.

2. The method of claim 1 wherein the step of performing a reflection calibration of the source port includes performing a reflection measurement with an open circuit calibration standard, performing a reflection measurement with a short circuit calibration standard, and performing a reflection measurement with a match load calibration standard.

3. The method of claim 1 wherein the step of correcting the measured reflection coefficient includes subtracting the product of the square of the measured transmission coefficient and the reflection coefficient of the load port.

4. The method of claim 2 wherein the step of performing a reflection calibration of the source port includes performing a reflection measurement with an open circuit calibration standard, performing a reflection measurement with a short circuit calibration standard, and performing a reflection measurement with a match load calibration standard.

* * * * *